(12) United States Patent
Gómez-Hidalgo

(10) Patent No.: US 10,043,631 B2
(45) Date of Patent: Aug. 7, 2018

(54) DEVICE FOR PROTECTING AGAINST OVERCURRENTS IN ELECTRIC CIRCUITS AND USES OF SAID DEVICE IN A FUSE LINK AND IN A RELATED LIMITING FUSE AS WELL AS IN FUSES FOR PROTECTING SEMICONDUCTORS

(71) Applicant: INDELCON 2007 S.L., Torrijos, Toledo (ES)

(72) Inventor: Félix Manuel Pérez Gómez-Hidalgo, Torrijos (ES)

(73) Assignee: INDELCON 2007 S.L., Torrijos, Toledo (ES)

( * ) Notice: Subject to any disclaimer, the term of this patent is extended or adjusted under 35 U.S.C. 154(b) by 166 days.

(21) Appl. No.: 14/902,524

(22) PCT Filed: Jul. 2, 2013

(86) PCT No.: PCT/ES2013/070453
§ 371 (c)(1),
(2) Date: Apr. 20, 2016

(87) PCT Pub. No.: WO2015/001140
PCT Pub. Date: Jan. 8, 2015

(65) Prior Publication Data
US 2016/0268093 A1  Sep. 15, 2016

(51) Int. Cl.
*H01H 85/38* (2006.01)
*H01H 85/041* (2006.01)
(Continued)

(52) U.S. Cl.
CPC .......... *H01H 85/38* (2013.01); *H01H 85/041* (2013.01); *H01H 85/165* (2013.01);
(Continued)

(58) Field of Classification Search
CPC .......... H01H 85/00; H01H 2085/0555; H01H 85/055; H01H 85/06; H01H 85/08;
(Continued)

(56) References Cited

U.S. PATENT DOCUMENTS

| 2,174,477 A | * | 9/1939 | Pittman | H01H 85/44 313/268 |
| 2,404,999 A | * | 7/1946 | Wallace | H01H 85/36 337/33 |

(Continued)

FOREIGN PATENT DOCUMENTS

| ES | 8305155 A1 | 6/1983 |
| ES | 2063226 T3 | 1/1995 |
| WO | 2013093033 A1 | 6/2013 |

OTHER PUBLICATIONS

International Search Report and its English Translation dated Mar. 14, 2014 for International Application No. PCT/ES2013/070453.

*Primary Examiner* — Anatoly Vortman
*Assistant Examiner* — Stephen Sul
(74) *Attorney, Agent, or Firm* — Joseph G. Chu; JCIP

(57) ABSTRACT

An overcurrent protection device comprises a current input terminal; a central terminal for output of current overshoots; and a terminal for output of non-impulse currents connected to a voltage of the central terminal. An electrical conductor element is connected between the input and output terminals at a reduced self-induction when operating without current overshoots. When current overshoots are present at the input terminal, the conductor produces a high drop of induction voltage between the input and output terminals. The central terminal is arranged in the vicinity of the input terminal at a distance that may be regulated. When due to current overshoot, the inductive voltage drop between the input and the non-impulse current output terminals exceeds the dielectric strength of the material present between the input and (Continued)

central terminals, an arc is generated between the input and central terminals to prevent the flow of current overshoots through the conductor element.

9 Claims, 6 Drawing Sheets

(51) Int. Cl.
*H01H 85/165* (2006.01)
*H01L 23/525* (2006.01)
*H01H 85/44* (2006.01)
*H01H 85/02* (2006.01)
*H01C 7/12* (2006.01)
*H01H 85/042* (2006.01)

(52) U.S. Cl.
CPC ......... *H01H 85/44* (2013.01); *H01L 23/5256* (2013.01); *H01C 7/12* (2013.01); *H01H 85/042* (2013.01); *H01H 2085/0283* (2013.01)

(58) Field of Classification Search
CPC ........ H01H 85/10; H01H 85/36; H01H 37/14; H01H 71/164; H01H 85/0047; H01H 61/02
USPC ........ 337/142, 273, 158, 159, 102, 103, 104
See application file for complete search history.

(56) References Cited

U.S. PATENT DOCUMENTS

| | | | | |
|---|---|---|---|---|
| 3,304,390 | A * | 2/1967 | Lindell | G01C 19/48 337/162 |
| 4,342,978 | A | 8/1982 | Meister | |
| 4,855,705 | A * | 8/1989 | Narancic | H01H 69/02 337/158 |
| 5,027,100 | A * | 6/1991 | Neuwirth | H01T 1/14 337/32 |
| 5,073,839 | A * | 12/1991 | Yallon | H01H 9/0011 337/229 |
| 5,198,791 | A * | 3/1993 | Shibayama | H01H 85/36 337/15 |
| 7,928,826 | B1 * | 4/2011 | Woychik | H01H 37/68 337/122 |
| 9,490,096 | B2 * | 11/2016 | Moody | H01H 85/042 |
| 2012/0019347 | A1 * | 1/2012 | Goedde | H01H 85/042 337/246 |

* cited by examiner

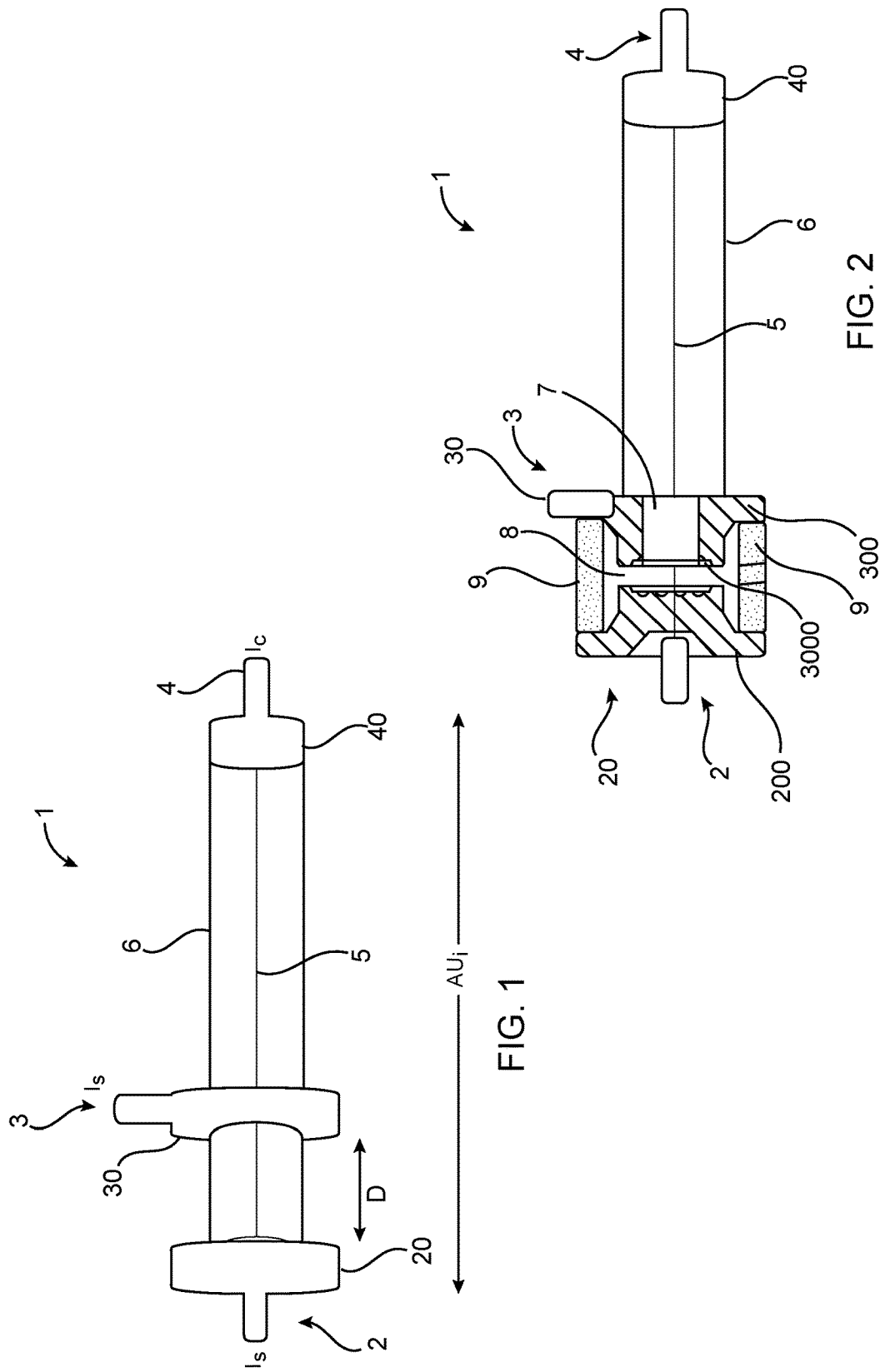

DEVICE FOR PROTECTING AGAINST OVERCURRENTS IN ELECTRIC CIRCUITS AND USES OF SAID DEVICE IN A FUSE LINK AND IN A RELATED LIMITING FUSE AS WELL AS IN FUSES FOR PROTECTING SEMICONDUCTORS

BACKGROUND OF THE INVENTION

1. Description of Prior Art and Related Information

The present invention generally refers to an overcurrent protection device for electrical circuits and to the use of such device on protection elements for electrical circuits, such as fuse links, associated limiter fuses and semiconductor protection fuses.

The protection of electrical devices that require fuses for small nominal currents up to some tens of amps, entails the problem of the unexpected and premature blowing of the fuse as a result of the presence of transient currents in the circuit, originated by events such as lightning strikes, opening and closing of circuits and electrostatic discharges. These events may generate, by electrical induction, overcurrents that may seriously damage the circuits, unless they are conveniently protected.

Impulse currents flowing through the electricity lines are catalogued according to international standards, and they may be broken down in three basic categories, namely lightning, steep and switching impulse currents. The most significant type, as far as premature fuse blowing is concerned, are the lightning-type impulse currents, originated as a result of the discharge of a lightning arrester after a lightning strike. Such impulses have a waveform of 8/20 µs, i.e., 8 µs of rise and 20 µs of fall, up to the half value of the queue length. As far as current width is concerned, these are usually peak values ranging from 5 kA to 10 kA for high Voltages and from 1 kA to 5 kA for secondary low voltage facilities.

To protect circuits against overvoltages, varistors or lightning arresters are mainly used. These devices earth the electrically induced energy, so that the voltage level reached by the equipment does not become dangerous. When this earth leak occurs, a transient current is generated, which crosses the whole circuit, so that if such transient current crosses a fuse, this might become blown.

Different solutions have been historically suggested to solve this problem. The first one consists of installing the lightning arrester upstream from the fuse, so that the current eventually leaked from the lightning arrester does not cross the said fuse. This solution became obsolete and is no longer actually used, since the protection margin afforded by the lightning arrester decreases with distance. This means that a really effective overvoltage protection must be installed at the connection terminals of the item to be protected, as close as possible to such item, both from a physical and from an electrical point of view.

For this reason, fuses are also being installed inside the transformer tank, which usually poses the problem that, in case that the fuse is blown, it is necessary to replace the whole transformer, on the assumption that if the fuse is blown, this means that the transformer is permanently damaged, which is not always true.

A solution which has been widely used comprises the use of fuses intended for a sufficiently high current, so that they do not blow as a result of impulse currents. Thus, some facilities incorporate 50 A fuses for the protection of transformers with a rated current of 1.44 A (50 kVA at 20 kV). Obviously, these fuses do not protect the transformer at all and, in case that they must be tripped as a result of a failure of the transformer, this latter may be already completely destroyed.

Another solution consists of slowing down the operation of the fuses in short times or, in other words, in the presence of high currents, such as impulses, so that they take more time to trip, and speeding such operation up at long times. These are the so-called "dual link" fuses, such as, for instance, those mentioned in U.S. Pat. No. 4,121,187, U.S. Pat. No. 5,300,914, U.S. Pat. No. 5,119,060 and U.S. Pat. No. 5,852,396.

Apart from this, there is a problem with the protection of power semiconductors, like diodes, SCR, IGBT, etc. These devices, that are characterised by their great switching capacity and the large number of operations that they may perform, are also very sensitive to current impulses, so that they may operate millions of times under their specified normal parameters, but they may become destroyed by a single impulse current of a few milliseconds. The solution for this problem consists of using the so-called semiconductor fuses, that are basically fast fuses, with low I2t operating values. Thus, the fuse receives the impulse and stops it, even though it becomes blown. The problem with these fuses is that they are so fast that they may also blow under certain circumstances such as prior heating, impulse trains, etc.

2. Field of the Invention

On the basis of the previously described state of the art, one of the objects of the invention is to develop a protection device of the above-mentioned type, which can be easily produced and is sufficiently strong from an electricity point of view. The invention is based on the idea that the low intrinsic self-induction of a conductor connected between a current input and a current output generates a high drop of inductive voltage between such terminals, in the presence of current overshoots at the current input, as a result of the high value of changes in current along the time, taking advantage of the high voltage drop caused by the presence of current overshoots to produce, with the help of the skin effect, a discharge arc through a third terminal, hereinafter the central terminal, which has been provided between the input terminal and the output terminal, such central terminal being externally put at a voltage similar to the voltage of the output terminal, thus preventing the flow of current overshoots through the electrical conductor element and passing such current overshoots through such central terminal.

This first object is achieved through the characteristics of an overcurrent protection devices as described herein. Other characteristics and advantages will be indicated through the characteristics described herein.

The overcurrent protection device for electrical circuits is characterised, according to the invention, in that it comprises:

a current input terminal;
  a central output terminal for current overshoots; and
  an output terminal for the output of non-impulse currents which is outwardly connected to the voltage of the central terminal, upstream from the current overshoot at the input terminal; and
  an electric conductor element connected between the current input terminal and the output terminal, such conductor showing a reduced self-induction when operating without current overshoots but, which, in case that current overshoots are present at the input terminal, produces a high drop of the induction voltage between such input terminal and the output terminal.

Wherein the central terminal is firmly arranged in the vicinity of the current input terminal, at a distance that may be adjusted so that when, as a result of a current overshoot, the drop of induction voltage between such input terminal and the output terminal for non-impulse currents exceeds the dielectric strength of the dielectric material present between the input and the central terminals, and thanks to the skin effect, an arc is produced between said input and central terminals, preventing the flow of current overshoots through the conductor.

According to an additional characteristic of the invention, it is advantageous to insert, between the current input terminal and the output terminal, a tube made of insulating material, wherein the electrical conductor element connected between the input terminal and the output terminal is housed inside such tube.

According to another characteristic of the invention, it is advantageous, from the point of view of ease of manufacturing, that the input terminal is connected to a disc-shaped electrode coupled to one of the ends of the insulating tube, and that the output terminal is connected to a casing arranged at the other end of such insulating tube, the central terminal being connected to, or forming part of a ring-shaped electrode which has been fixed around the insulating tube.

According to yet another additional characteristic of the invention, and in order to control the discharge arc, it is advantageous that the electrode of the input terminal comprises a neck portion, and that the electrode of the central terminal also comprises a neck portion incorporating a central hole where an insulating sleeve is housed, wherein such sleeve is crossed by the electrical conductor element, and where the relevant neck portions extend within an area which is delimited by the walls of a cylindrical, gas-tight element inserted between both electrodes, defining a controlled atmosphere discharge chamber for the generation of the arc between the relevant neck portions of the electrodes, such insulating tube extending between the lower end of the electrode of the central terminal and the casing of the output terminal.

Furthermore, according to yet another characteristic of the invention, it is easier to connect the protection device by welding or crimping, provided that both the current input terminal and the output terminal protrude from the ends of the insulating tube and all the terminal ends are arranged in the shape of a shovel or tube.

Also according to another additional characteristic of the invention, it is advantageous that the dielectric strength of the insulating tube is higher than that of the surrounding medium.

According to yet another additional characteristic of the invention, the dielectric strength of the insulating tube may be adjusted if such tube is provided with holes, for instance, eliminating wall sections of such tube, at the area comprised between the input and the central terminals.

Furthermore, it may be advantageous, according to another characteristic of the invention, that the electrodes of the input and central terminals, or the neck-shaped portions of such electrodes, are connected by means of a varistor or condenser. Furthermore, it is possible to advantageously connect, between the input and the central terminals, a varistor or condenser incorporating a hole through which the conductor runs.

According to yet another additional characteristic of the invention, the electrical conductor element is advantageously provided as a conducting wire, either following a straight pattern or wound in spires, whose diameter, length and number of spires are respectively chosen depending on the rated current of the fuse and the self-induction value desired for such electrical conductor element, or providing such conductor as an actual ballast as such.

Even according to yet another additional characteristic of the invention, the generation of the discharge arc is facilitated thanks to a magnetic repulsion effect, when the insulating tube consists of a flexible material, so that it can be arranged as a wrapped configuration, with a toroidal cross-section.

Another additional object of the invention is to use the protection device by connecting it to a fuse link of a circuit. This objective is achieved by means of the characteristics described herein.

To that effect, a fuse link incorporates a connecting cap; a link header connected to the connecting cap; a first connection, which is connected to the link header; a second connection, which is connected to a third connection of a pigtail connection through a fusible element; a tensioning wire coupled between the second and the third connections; and an ancillary protection tube wherein the link header, the first and second connections, the fusible element, the tensioning wire and part of the connecting pigtail are encapsulated, and wherein the protection device against overcurrents is connected at such fuse link to the first connection of the fuse link by means of the input terminal, to the second connection of the fuse link by means of the output terminal, and to the third connection of the fuse link by means of the central terminal, through an overcurrent-resistant conducting wire.

Another additional object of the invention is the use of the protection device while it is connected to an associated limiter fuse of a circuit. Such object is achieved by means of the characteristics explained herein.

Thus, we have an associated limiter fuse respectively incorporating a first and a second connection capsules; a fusible element arranged following a spiral layout around an insulating core which extends between the connection capsules; a first contact portion connected to the first connection capsule and another contact portion, separated from the first portion, which is connected to the fusible element; a third contact portion which is adjacent to the second contact portion and which is electrically insulated from such portion by means of an insulating portion, and a fourth metal contact element which is connected to the second connection capsule, wherein the overcurrent protection device is connected to such fuse link, with the input terminal connected to the first contact portion; the output terminal, to the second contact portion, and the central terminal to the third contact portion, by means of a non-fusible conductor.

Another additional object of the invention is the use of the protection device while it is connected to a protection fuse for semiconductors. This objective is achieved by means of the characteristics indicated herein.

Thus, we have a semiconductor protection fuse including a first and a second connection capsules; and a main fusible element extending between such first and second connection capsules, wherein the overcurrent protection device is connected to such protection fuse with the input terminal connected to the first connection capsule and the output terminal connected to the main fusible element of the protection fuse, while the central terminal is connected, through a non-fusible connecting wire, to the main fusible element; and wherein, if appropriate, a protection element, such as a condenser or varistor is connected between the input terminal and the central terminal.

BRIEF DESCRIPTION OF THE DRAWINGS

Other characteristics and advantages of the invention will become apparent from the following detailed description thereof, to be read in conjunction with the accompanying drawings with regard to non limitative embodiments of the invention, where:

FIG. 1 shows a schematic view of a protection device according to the invention.

FIG. 2 also shows a schematic view of an alternative embodiment of a device according to the invention.

DETAILED DESCRIPTION OF THE PREFERRED EMBODIMENTS

Figure 3:
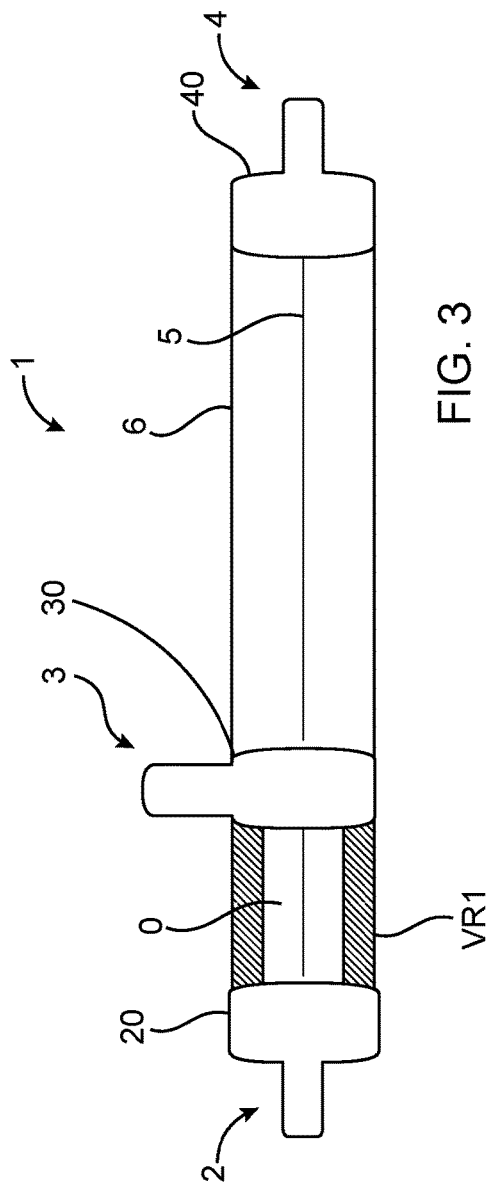
FIGS. 3 and 4 respectively show schematic views of two alternative embodiments of the device according to the invention.

As shown in the figures, the overcurrent protection device generally denoted by the reference numeral (1) comprises a current input terminal (2); a central terminal (3) aimed at outputting any current overshots (Is) that might occur during the operation; an output terminal (4) for the output of non impulse currents (Ic); and an electrical conductor element (5) connecting such input and output terminals (2 and 4). It can be appreciated that the central terminal (3) is fixed in the vicinity of the input terminal (2) at a distance (D) that can be regulated.

Thus, before the presence of any current at the current input terminal (2), the central terminal (3) and the output terminal (4) are equipotential, since they are outwardly connected.

The electrical conductor element (5) intrinsically presents a low self-induction value (L). Thus, during the operation, in the absence of overcurrents between the input and output terminals (2 and 4) no voltage drops can be appreciated; however, when current overshots (Is) are present at the current input terminal (2) between such input terminal (2) and the output terminal (4), a high inductive voltage drop ($\Delta$Ui) can be appreciated, as a result of the high increase over time of the current changes caused by the current overshoot ($I_s$).

As the central terminal (3) is firmly arranged at a distance (D) in the vicinity of the current input terminal (2), when, as a result of a current overshoot, the inductive voltage drop ($\Delta$Ui) between the input terminal (2) and the output terminal (4) exceeds the dielectric strength of the dielectric material present between the input and central terminals (2 and 3), and thanks to the skin effect, an arc is generated between such current input terminal (2) and such central terminal (3), thus preventing the flow of current overshoots (Is) through the electrical conductor element (5) and such overshoots will then flow through such central terminal (3).

According to an embodiment of the invention, an insulating tube (6) made of an insulating material extends between the current input terminal (2) and output (4) terminals, wherein such tube houses the electrical conductor element (5) which is connected between said input and output terminals (2 and 4).

Additionally, and according to another embodiment of the invention, the current input terminal (2) is connected to a disc-shaped electrode (20) coupled to one of the ends of the insulating tube (6), and the output terminal (4) is connected to a casing (40) arranged at the other end of such insulating tube, while the central terminal (3) is connected to, or forms part of a ringshaped electrode (30) which has been fixed around the insulating tube (6).

The operation of the device according to the invention, by virtue of which the current overshoots (Is) flow between the current input terminal (2) and the central terminal (3), while nonimpulse currents flow through the input and output terminals (2 and 4), is based, on the one hand, on the Skin or Kelvin effect, by virtue of which electric current tends to flow through the surface of the conductor, instead of through its core, especially in the case of high-amplitude and high-frequency currents and, on the other hand, on the high inductive voltage drop between the current input terminal (2) and the output terminal (4), facilitated by the fine and long wire configuration used, which generates self-induction which, although reduced, is quite significant when current overshoots are present.

In a simplified manner, the inductive voltage drop is expressed as $\Delta U_i = L \, dI_s/dt$, $I_s$ being the current generated by the overshoot, and L being the self-induction value of the conductor element (5), so that, even though the self-induction value may be low, the voltage drop between the input and output terminals (2 and 4) will be high, thanks to the high value of $dI_s/dt$ at the overshoots; furthermore, before any current is present, the central terminal (3) is put at the same voltage as the output terminal (4), and when the current is present, before the impulse currents, the voltage between the input and output terminals (2 and 4) is almost the same as the voltage between the input and central terminals (2 and 3). Thanks to this similarity of voltages, upon the occurrence of the current overshoots and the subsequent increase in the inductive voltage drop, and with the help of the aforementioned skin effect, an electric arc will be generated between the casings (20, 30) of the input and central terminals (2 and 3) when the voltage between the input and central terminals (2 and 3) exceeds the dielectric strength of the insulating medium existing between both casings.

This way, when such electric arc is established, the whole current generated by the current overshoots will flow between the input and central terminals (2 and 3) through the insulating medium present between both terminals, or in other words, without passing through the electrical conductor element (5). Once the current overshoot has been extinguished and the normal current has been re-established at power frequency, the dI/dt values will decrease, as well as the inductive voltage drop, as a result of the low self-inductance of the electrical conductor element (5) and, as once again, the voltage at the central terminal (3) will be very similar to that of the output terminal (4), when the voltage drop of the arc between the input and the central terminal (2 and 3) exceeds the voltage drop between the input and output terminals (2 and 4) if current flows through the electrical conductor element (5), the non impulse current will flow again through the electrical conductor element, i.e., between the input and output terminals (2 and 4) and the arc will disappear.

Therefore, through a careful selection of the length, diameter and material of the conductor element (5), the distance (D) between the casings of the input and central terminals (2 and 3) and the shape of such terminals, the operation of the overcurrent protection device (1) can be adjusted, so that relatively low-amplitude and low-frequency currents flow through the electrical conductor element (5) connected between the input and output terminals (2 and 4), while high currents and frequencies flow between the input and central terminals (2 and 3) through the insulating medium, outside the tube.

So that the discharge of the arc takes place within a controlled environment, according to another embodiment, the electrode (20) of the current input terminal (2) is provided with a neck portion (200) and the electrode (30) of the central terminal (3) is also provided with a neck portion (300) including a central hole (3000) wherein an insulating sleeve (7) is housed, which is crossed by the electrical conductor element (5) and wherein the relevant neck portions (200, 300) extend within a space (8) delimited by the walls of a gas-tight insulating cylindrical element (9), coupled between both electrodes (20, 30), so that such space (8) defines a discharge chamber to control the generation of the electric arch between the respective neck portions (200, 300) of the relevant input and central terminals (2 and 3). In this case, the insulating tube (6) extends between the lower end of the electrode (30) of the central terminal (3) and the casing (40) of the output terminal (4).

To facilitate the connection of the terminals to other conductors (not shown) the current input terminals (2 and 4) protrude from the ends of the insulating tube (6). Furthermore, all the terminal ends (2 and 3, 4) are arranged in the shape of a shovel or tube, thus allowing that other conductors can be connected to them, either by welding or crimping.

According to an advantageous embodiment of the invention, to allow that the discharge arc between the input and central terminals (2 and 3) is generated outside the insulating tube (6), i.e. through the exterior medium surrounding both terminals, the dielectric strength of the material of the insulating tube (6) is higher than that of the surrounding medium.

As it can be seen in FIG. 3, in an alternative embodiment of the invention, a varistor (VR1) with a central hole (0) which is crossed by the electrical conductor element (5) is arranged between the casings (20, 30) of the input and central terminals (2 and 3). Such varistor shows a V-t (time voltage) characteristic which is markedly non-linear, and consequently, it behaves as an insulator up to a certain voltage value, known as "clamping voltage" at which time it behaves as a conductor. Thus the varistor accurately derives the current of the input and output terminals (2 and 4) to the input and central terminals (2 and 3) since the "clamping voltage" is a very stable value for a complete range of varistors.

Although it has not been depicted, the varistor mat be replaced, if appropriate, by a condenser, that will show an impedance which is reversely proportional to the frequency, and consequently, at high frequencies, the impedance will be low, which allows that the impulses may be established between the input and central terminals (2 and 3) in the presence of overshoots at the current input terminal (2).

Figure 4:
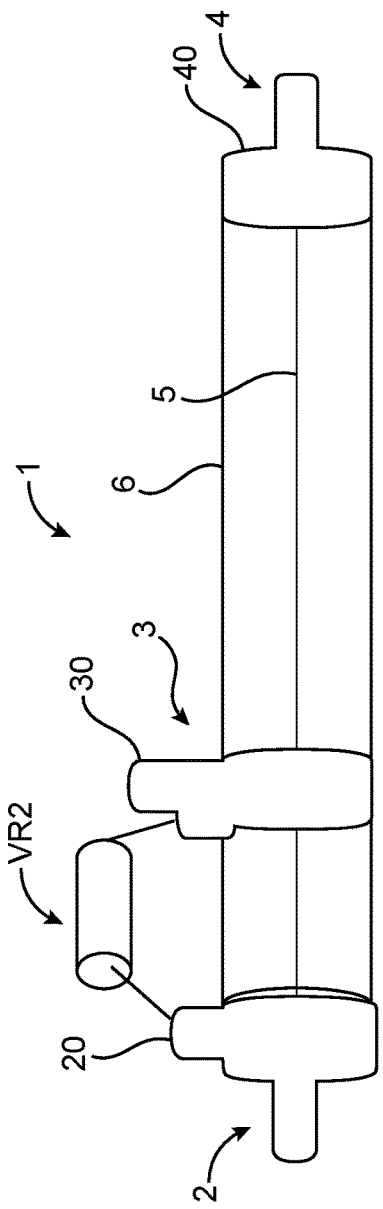

It is also possible, as shown in FIG. 4, to insert, directly connected between the connections of the casings (20, 30) of the input and central terminals (2 and 3) a varistor (VR2) without a central hole, which is less expensive than a perforated varistor. Even though it is neither depicted, such varistor may be also replaced by a condenser, also without perforations.

Referring again to FIGS. 1 and 2, it can be appreciated that the electrical conductor element (5) is provided as a wire, whose diameter and length can influence its self-inductance value (L), as well as the adjustment at the supported currents under normal operating conditions. Furthermore, such electrical conductor element (5) may be arranged as a wire wound in spires (not depicted), so that the length of the protection device may be reduced and the self-inductance value may be selected, but such electrical conductor element (5) may be also actually arranged as a ballast. In such a case, it should be taken into account that the relevant increase of the self-inductance value favours the generation of an arc between the input and central terminals (2 and 3), but limits the amount of the non-impulse current that may flow in normal conditions (rated current), in other words, in the absence of overshoots, between the input and output terminals (2 and 4).

On the other hand, it is possible to modify the operating parameters of the overcurrent protection device (1), providing an insulating tube (6) with holes (not depicted), for instance eliminating portions of wall of such tube, to facilitate the formation of an arch between the input and central terminals (2 and 3) thanks to the repulsion of the electrical conductor element (5) generated by the skin effect.

On the other hand, the insulating tube (6) may be provided as a flexible material, for instance, hard silicone, so that it can be wound forming a toroidal cross-section pattern (not shown). This way, it is possible to generate a magnetic repulsion effect at the overcurrent protection device (1) that facilitates the generation of a discharge arc between the input and central terminals (2 and 3).

As it will be easily appreciated by any person skilled in the art, a protection device according to the previous description may be easily encapsulated, so that it may be used as a single element at any electrical or electronic circuit.

Use of the Protection Device on a Fuse Link

A protection device according to the previous description can be advantageously used on a fuse link resistant to current overshoots.

The so-called fuse link is a device which is commonly used to protect against overcurrents in electrical and electronic circuits. As it is shown in FIG. 5, a typical fuse link (10) comprises: a connecting cap (100); a link header (101) connected to the connecting cap; a first connection (102) which is connected to the link header; a second connection (103) which is connected to a third connection (105) of a pigtail connection (106) through a fusible element (104); a tensioning wire (107) coupled between the second and the third connections; and an ancillary protection tube (108) which serves to encapsulate the link header, the first and second connections, the fusible element, the tensioning wire and part of the connecting pigtail.

The operation of a fuse link of this kind is not included within the scope of this invention, and is described, for instance, in U.S. Pat. No. 6,583,708 which is incorporated herein by reference.

Figure 5:
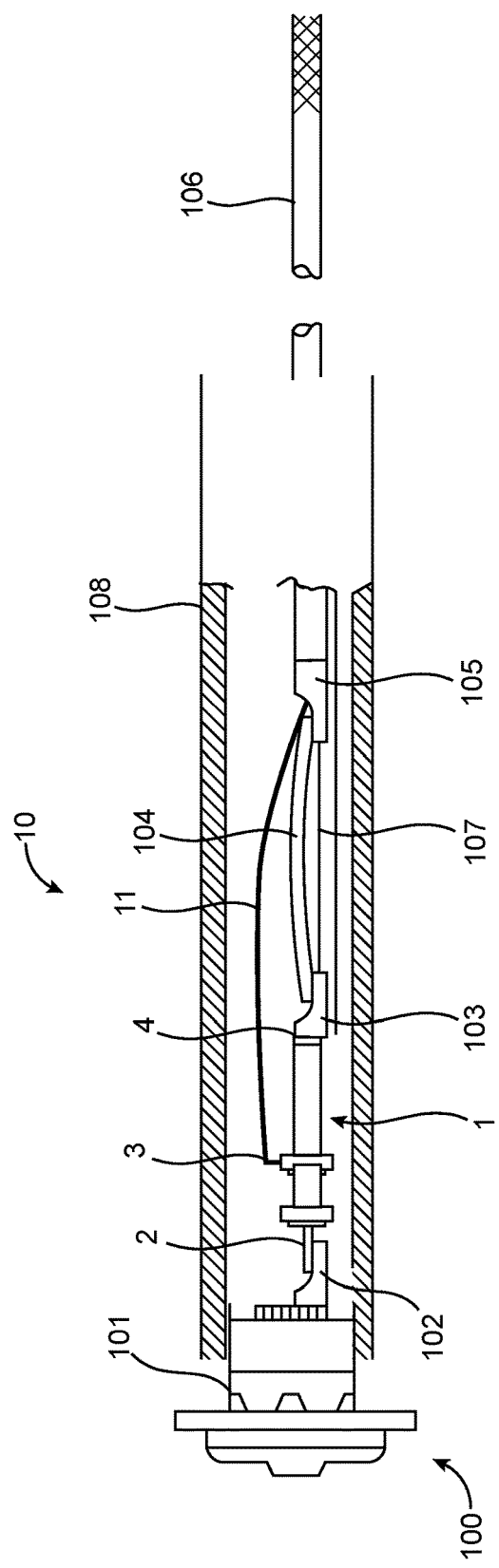
FIG. 5 shows a longitudinal view of a fuse link incorporating the protection device according to the invention.

According to the invention, and as it is shown in FIG. 5, the overcurrent protection device (1) against overcurrents will be coupled to such fuse link (10) connecting its current input terminal (2) to the first connection (102) of the fuse link, the output terminal (4) to the second connection (103) of the fuse link and the central terminal (3) to the third connection (105) of the fuse link through a non-fusible conductor wire (11).

Use of a Protection Device on an Associated Limiter Fuse

A protection device according to the above description can be also advantageously used on a fuse link which is resistant to impulse currents, of the type used for the protection of electrical and electronic circuits.

Figure 6:
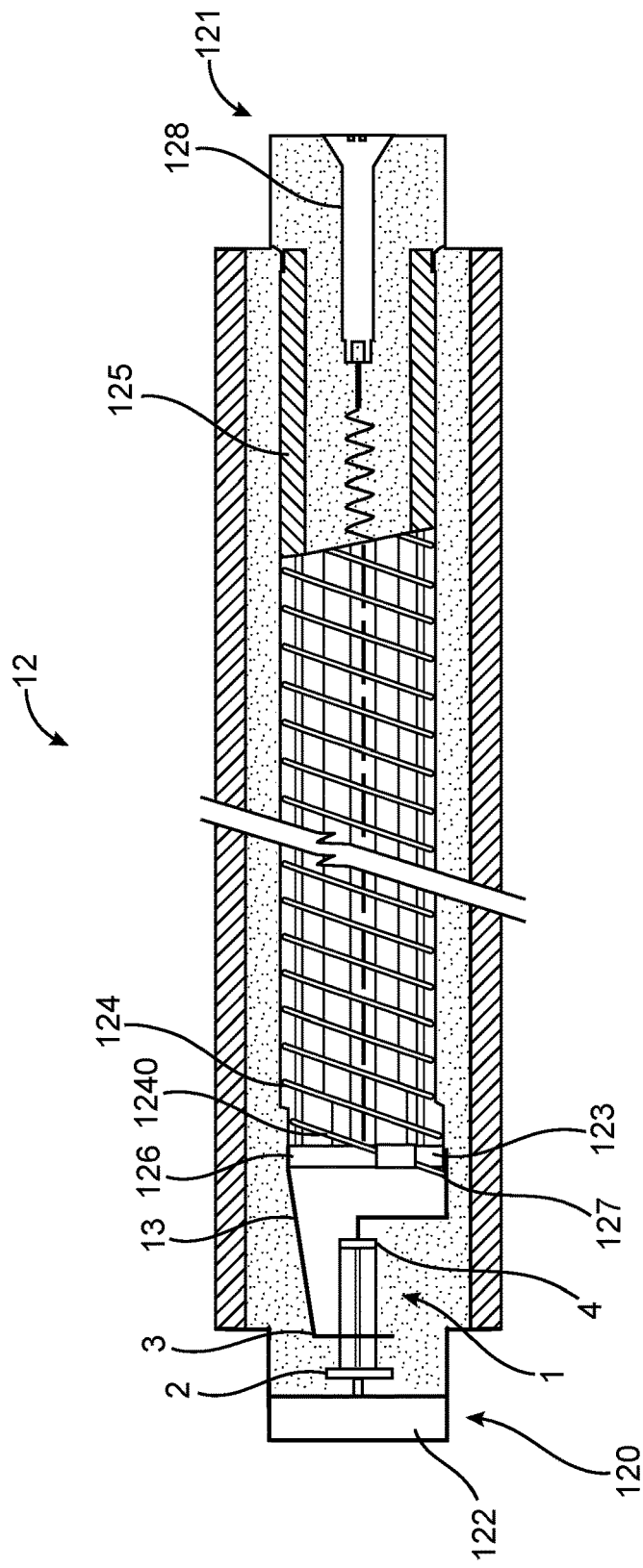
FIG. 6 shows a longitudinal view of an associated limiter fuse incorporating a protection device according to the invention.

Typically, as it is shown in FIG. 6, an associated limiter fuse (12) incorporates: a first (120) and a second (121) connection capsules; a first contact portion (122) which is connected to the first connection capsule (120) and a second contact portion (123), separated from the first portion, which is connected to the main fusible element (124) arranged following a spiral layout around a central core (125); a third contact portion (126) which is adjacent to the second contact portion and which is electrically insulated from such portion by means of an insulating portion (127), wherein a secondary fusible element (1240) which is resistant to current overshoots, and which is also arranged in spiral around the central core (125) is connected to such third contact portion, parallel to the main fusible element (124); and a fourth metal contact element (128), which is connected to the second connection capsule (121).

According to the invention, and as it has been depicted in FIG. 6, an overcurrent protection device (1) according to the previous description is connected to such fuse link (12) with the current input terminal (2) connected to the first contact portion (122), the output terminal (4) connected to the second contact portion (125) and the central terminal (3) connected to the third contact portion (126) through a connecting wire (13) which is not fused by current overshoots.

Use of a Protection Device on a Semiconductor Protection Fuse

A protection device according to the previous description can be also advantageously used on a semiconductor protection fuse.

Figure 7A:
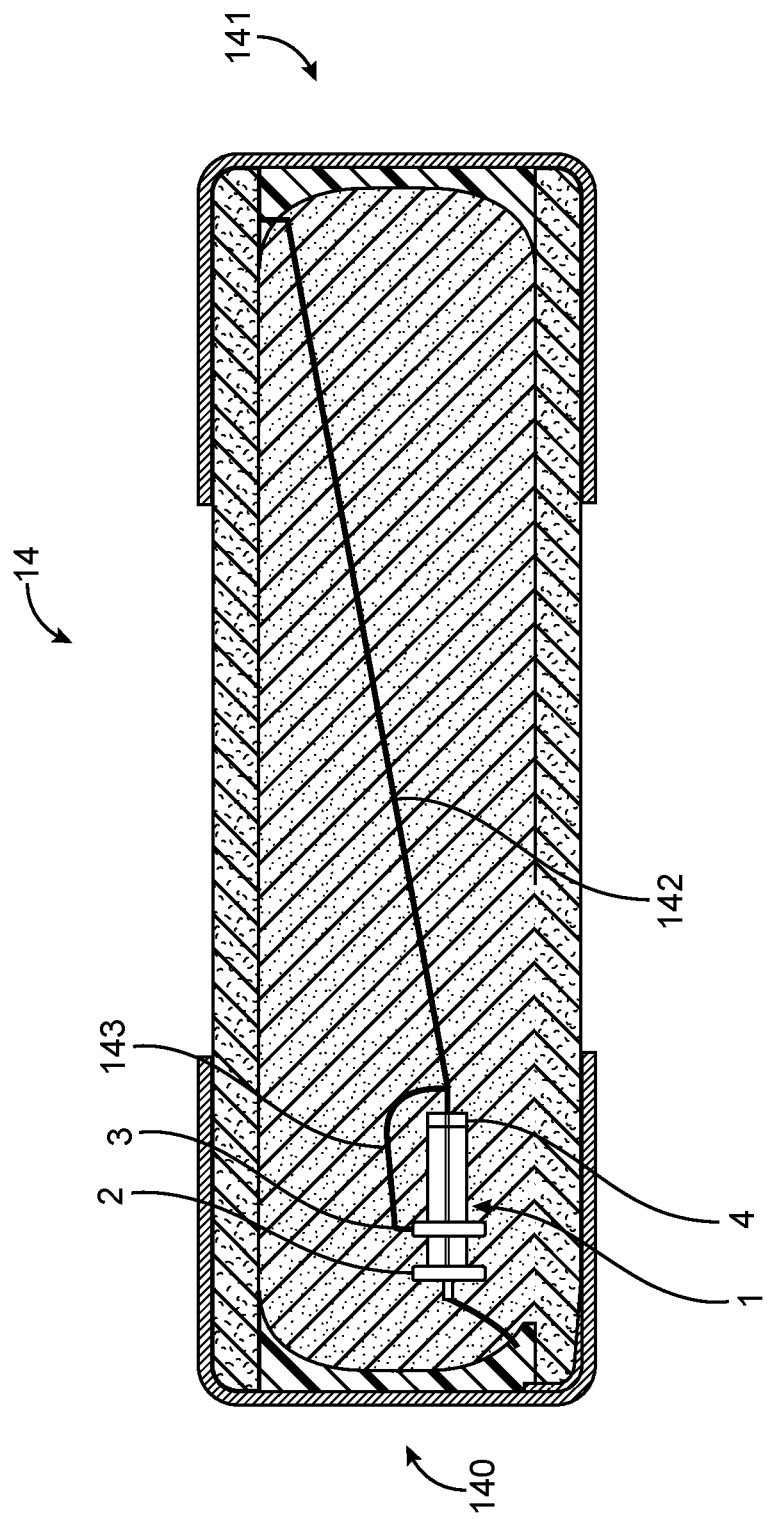
FIGS. 7A and 7B respectively show longitudinal views of a semiconductor protection fuse incorporating a protection device according to the invention.

Typically, as it is shown, for instance, in FIG. 7A, a semiconductor protection fuse (14) comprises: a first (140) and a second (141) connection capsules; and a main fusible element (142) extending between such first and second connection capsules.

According to the invention, and as it has been shown in the aforementioned FIG. 7A, a overcurrent protection device (1) against overcurrents according to the previous description is connected to such protection fuse (14) with the current input terminal (2) connected to the first connection capsule (140), the output terminal (4) connected to the main fusible element (142) of the protection fuse (14) and the central terminal (3) connected, through a non-fusible connecting wire (143) to the main fusible element (143).

Figure 7B:
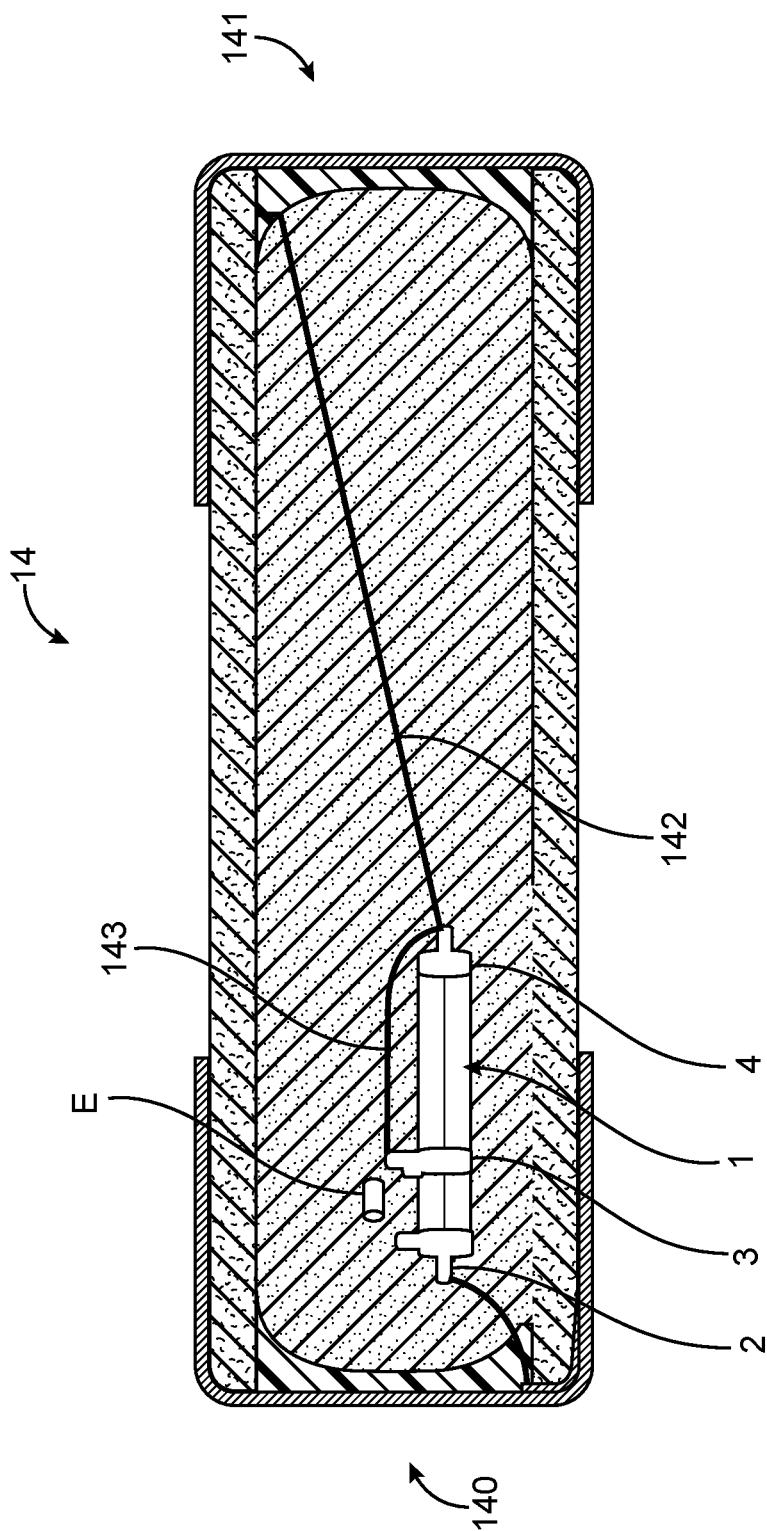

Alternatively, and as shown in FIG. 7B, a protection element (E) such as a condenser or varistor can be provided, connected between the current input terminal (2) and the central terminal (3).

As it will be easily understood by any person skilled in the art, all the above is a mere illustration of the preferred embodiments of the invention and, for instance, apart from the above-mentioned uses, the protection device against impulse currents can be advantageously used to protect, among others, power semiconductor devices. Thus, any kind of technical changes can be introduced, and the invention will be limited only by the scope of the following claims.

The invention claimed is:

1. An overcurrent protection device for electrical circuits, comprising:
   a current input terminal (2);
   a central terminal (3) for an output of current overshoots ($I_s$); and
      an output terminal (4) for an output of non impulse currents ($I_e$) which is outwardly connected to a voltage of the central terminal (3) before an occurrence of the current overshoot (Is) at the current input terminal (2); and
      an electrical conductor element (5) connecting the current input terminal (2) and the output terminal (4), the electrical conductor element having reduced self-induction (L) at current levels below the overcurrent condition and the electrical conductor element having greater self-induction at the overcurrent condition such that when operating without current overshoots but, which, in case that current overshoots are present at the current input terminal (2), a high inductive voltage drop ($\Delta U_i = L \cdot dI_s/dt$) is established between the current input terminal (2) and the output terminal (4);
   wherein the central terminal (3) is firmly arranged in the vicinity of the current input terminal (2) at a distance (D) that can be regulated, so that, when the inductive voltage drop ($\Delta U_i$) between the current input terminal (2) and the output terminal (4), as a result of a current overshoot, exceeds a dielectric strength of a dielectric material present between the input and central terminals (2 and 3), also as a result of a skin effect, an electric arc is generated between the current input terminal (2) and the central terminal (3), eliminating the flow of the current overshoots ($I_s$) through the electrical conductor element (5)
   wherein the overcurrent protection device is used on an associated limiter fuse (12) resistant to current overshoots, wherein the associated limiter fuse (12) respectively comprises:
      a first (120) and a second (121) connection capsules;
      a first contact portion (122) which is connected to the first connection capsule (120) and a second contact portion (123), separated from the first portion, connected to a main fusible element (124) which is arranged following a spiral layout around a central core (125);
      a third contact portion (126) which is adjacent to the second contact portion and which is electrically insulated from the second portion by means of an insulating portion (127), wherein a secondary fusible element (1240) which is resistant to current overshoots and which is also arranged following a spiral layout around the central core (125) parallel to the main fusible element (124) is connected to said third contact portion;
      a fourth metal contact element (128) which is connected to the second connection capsule (121),
   wherein the overcurrent protection device (1) is connected to a fuse link (12) with the current input terminal (2) connected to the first contact portion (122), the output terminal (4) connected to the second contact portion (123) and the central terminal (3) connected to the third contact portion (126) through a non-fusible connection conductor (13).

2. The overcurrent protection device for electrical circuits according to claim 1, comprising an insulating tube (6) made of insulating material coupled between the current input terminal (2) and the output terminal (4) for non impulse currents, wherein the insulating tube houses the electrical conductor element (5) connected between the current input terminal (2) and the non impulse current output terminal (4), the insulating tube (6) having a greater dielectric strength than the surrounding medium.

3. The overcurrent protection device for electrical circuits according to claim 2, characterised in that the current input terminal (2) is connected to a disc-shaped electrode (20) which is coupled to one end of the insulating tube (6), and the current output terminal (4) is connected to a casing (40) arranged at the other end of the insulating tube, while the central terminal (3) is connected to, or forms part of a ring-shaped electrode (30) arranged around the insulating tube (6), and where the current input terminal (2) and the current output terminal (4) protrude from the ends of the insulating tube (6) and wherein all the terminals (2 and 3, 4) end on a shovel or tube shape, so that other conductors may be connected to them by welding or crimping.

4. The overcurrent protection device for electrical circuits according to claim 3 characterised in that the disc-shaped electrode (20) of the current input terminal (2) is provided with a first neck portion (200) and the ring-shaped electrode (30) of the central terminal (3) also comprises a second neck portion (300) with a central hole (3000) wherein an insulating sleeve (7) is housed, which is crossed by the electrical conductor element (5) and wherein the first and second neck portions (200, 300) respectively extend within an area (8) delimited by the walls of a cylindrical, gas-tight element (9) inserted between both disc-shaped and ring shaped electrodes (20, 30), the area defining a controlled atmosphere discharge chamber for the generation of the arc between the relevant first and second neck portions (200, 300) of the relevant terminals (2 and 3), wherein the insulating tube (6) extends between the lower end of the ring-shaped electrode (30) of the central terminal (3) and the casing (40) of the output terminal (4).

5. The Overcurrent protection device for electrical circuits according to claim 4, characterised in that either the disc-shaped and ring-shaped electrodes (20, 30) of the input and central terminals (2 and 3), or the first and second neck-shaped portions (200, 300) of the electrodes are connected by means of a varistor (VR) or a condenser (C).

6. The overcurrent protection device for electrical circuits according to claim 3, characterised in that a varistor (VR), or a condenser (C), comprising a central hole which is crossed by the electrical conductor element is inserted between the disc-shaped and ring-shaped electrodes (20, 30) of the input and central terminals (2 and 3).

7. The overcurrent protection device for electrical circuits according to claim 2 characterised in that the insulating tube (6) has holes instance, eliminating wall sections of the tube.

8. The overcurrent protection device for electrical circuits according to claim 2 characterised in that the insulating tube (6) is made of a flexible material, so that it can be arranged as a wrapped configuration, following a toroidal cross-section pattern.

9. The overcurrent protection device for electrical circuits according to claim 1, characterised in that the electrical conductor element (5) is provided, either as a straight conducting wire or wound in spires, whose diameter, length and number of spires are respectively chosen depending on the a rated current of a fuse and a self-induction value desired for the electrical conductor element, or providing the conductor as an actual ballast.

* * * * *